United States Patent
Biesenecker et al.

(10) Patent No.: US 6,624,550 B2
(45) Date of Patent: Sep. 23, 2003

(54) PIEZOELECTRIC BENDING TRANSDUCER

(75) Inventors: Horst Biesenecker, Schneckenlohe (DE); Michael Riedel, Rödental (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/085,923

(22) Filed: Feb. 28, 2002

(65) Prior Publication Data

US 2002/0109439 A1 Aug. 15, 2002

Related U.S. Application Data

(63) Continuation of application No. PCT/DE00/02613, filed on Aug. 4, 2000.

(51) Int. Cl.$^7$ ................................................. H01L 41/08
(52) U.S. Cl. ........................ 310/330; 310/331; 310/346
(58) Field of Search ................................. 310/330–332, 310/346

(56) References Cited

U.S. PATENT DOCUMENTS

| 3,171,048 A | * | 2/1965 | Gerber | 310/346 |
| 4,047,060 A | * | 9/1977 | Schafft | 310/322 |
| 4,363,993 A | * | 12/1982 | Nishigaki et al. | 310/332 |

FOREIGN PATENT DOCUMENTS

| JP | 03 009 519 | | 1/1991 | H01L/21/306 |
| JP | 3-64081 | * | 3/1991 | 310/330 |
| JP | 3-209885 | * | 9/1991 | 310/330 |
| WO | WO 96/41384 | | 12/1996 | H01L/41/09 |

* cited by examiner

Primary Examiner—Thomas M. Dougherty
(74) Attorney, Agent, or Firm—Laurence A. Greenberg; Werner H. Stemer; Ralph E. Locher

(57) ABSTRACT

A piezoelectric bending transducer having a supporting element and a piezoelectrically active layer applied to at least one side of the supporting element. In order to reduce the inherent thermal distortion, an adaptation layer with a predefined volume is applied to the piezoelectrically active layer.

10 Claims, 1 Drawing Sheet

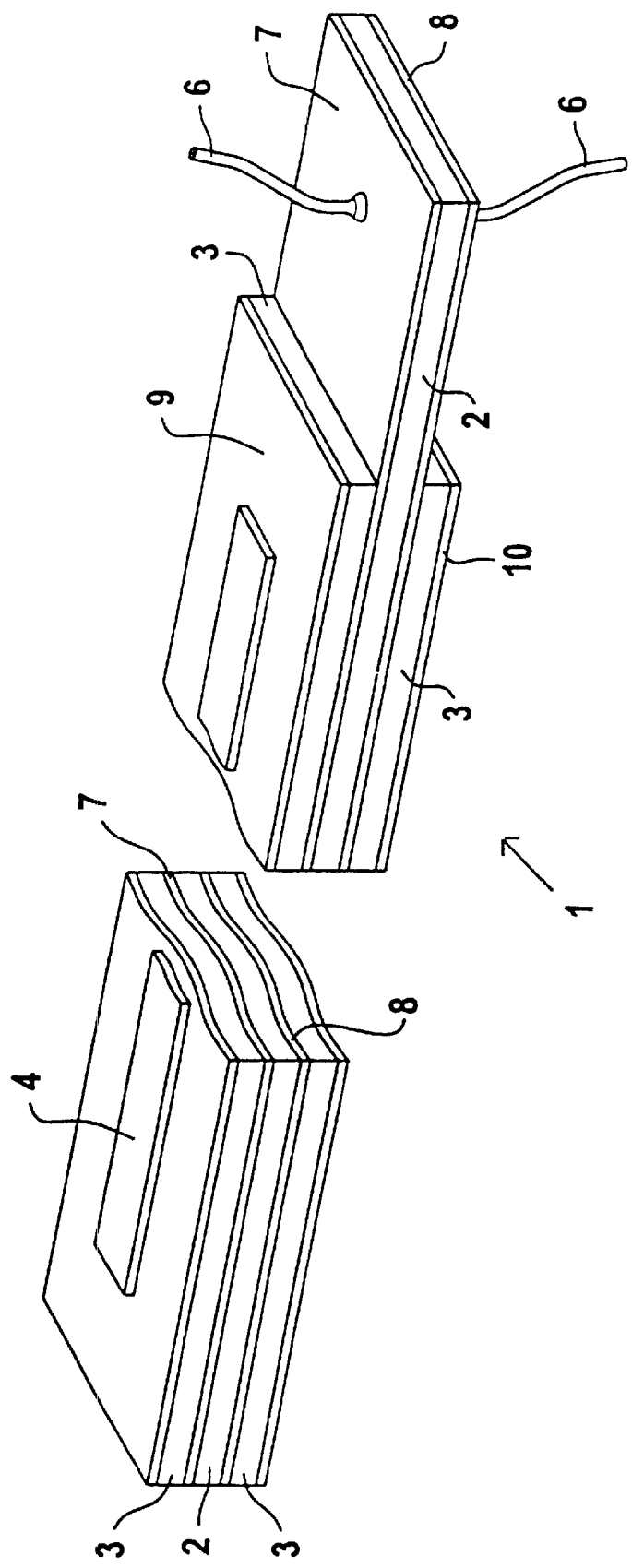

PIEZOELECTRIC BENDING TRANSDUCER

CROSS-REFERENCE TO RELATED APPLICATION

This application is a continuation of copending International Application No. PCT/DE00/02613, filed Aug. 4, 2000, which designated the United States.

BACKGROUND OF THE INVENTION

Field of the Invention

The invention relates to a piezoelectric bending transducer with reduced inherent thermal distortion.

A bending transducer of this type is disclosed by International Publication WO 96/41384 A1, for example. The bending transducer shown therein includes a supporting element and a piezoelectrically active layer of a piezoceramic applied to at least one side of the supporting element. In order to compensate for the inherent thermal distortion, it is proposed to use materials with substantially the same thermal coefficients of expansion for the piezoceramic and for the supporting element.

A piezoelectric bending transducer with a piezoelectric layer applied to a supporting element primarily uses the indirect or reciprocal piezoelectric effect, that is to say, it converts electrical energy into mechanical energy. There are a large number of technical applications for a bending transducer. Bending transducers have applications that include, for example, a piezoelectric print head for an ink jet printer, a sound pick-up or generator for microphones or loudspeakers, a sensor for measuring acceleration or pressure, and a setting element in lines of Braille. Bending transducers can also be used in, for example, readers for blind persons, textile machines, valves, recording measuring instruments, and non-contact surface measuring instruments.

In particular when the deflection provided by the bending transducer is small (10 to 200 $\mu$m), inherent thermal distortion occurring in the event of a temperature change can lead to the failure of a system that is operated with a bending transducer. A bending transducer with a very low inherent thermal distortion is required, for example, when applied in a valve, in particular in a pneumatic valve. In a valve, if the bending transducer has inherent distortion that can no longer be tolerated because of a temperature change, then the closing function of the valve, for example, is no longer ensured.

However, even with the bending transducer proposed in International Publication WO 96/41384 A1, inherent distortion of a few $\mu$m/10° K disadvantageously remains. Such inherent distortion can not be tolerated in valve technology. In practice hitherto, therefore, bending transducers for the respective application are found by appropriate selection from the fabrication batch. However, this method is very complicated, and moreover, has the disadvantage that high fabrication waste is unavoidable. Bending transducers with inherent distortion outside the tolerance band cannot be used and are therefore waste.

SUMMARY OF THE INVENTION

It is accordingly an object of the invention to provide a piezoelectric bending transducer which overcomes the above-mentioned disadvantages of the prior art apparatus of this general type.

In particular, it is an object of the invention to provide a piezoelectric bending transducer with an inherent thermal distortion that is further reduced as compared with the prior art and that may be produced without high fabrication waste.

With the foregoing and other objects in view there is provided, in accordance with the invention, a supporting element having opposite sides; a piezoelectrically active layer applied to at least one of the sides of the supporting element; and an adaptation layer for reducing inherent thermal distortion. The adaptation layer has a predefined volume, and the adaptation layer is applied to the piezoelectrically active layer.

In accordance with an added feature of the invention, the piezoelectrically active layer is applied to both of the sides of the supporting element, and the adaptation layer is applied to one of the sides of the adaptation layer.

In accordance with an additional feature of the invention, the adaptation layer is a screen-printed layer.

In accordance with another feature of the invention, the adaptation layer is a plastic suitable for screen printing.

In accordance with a further feature of the invention, the adaptation layer is an epoxy resin.

In accordance with a further added feature of the invention, the piezoelectrically active layer is a piezoceramic.

In accordance with a further additional feature of the invention, an electrode is interposed between the adaptation layer and the piezoelectrically active layer.

In the case of a piezoelectric bending transducer of the type mentioned at the beginning, which has a supporting element and a piezoelectrically active layer applied to at least one side of the supporting element, the object of the invention is achieved, by applying an adaptation layer with a predefined volume to the piezoelectrically active layer. If appropriate, an electrode is interposed between the adaptation layer and the piezoelectrically active layer.

Here, the invention is based on the thought that, during the previous selection processes to find those bending transducers in a batch which exhibit the required low inherent thermal distortion, the temperature variation, that is to say the inherent distortion, for each OK must be determined. The invention is, then, further based on the thought that, after the determination of the temperature variation or of the temperature coefficient of the inherent distortion, the inherent distortion can be compensated for or can be reduced by additionally applying a suitable adaptation layer to the bending transducer. In a further step, the reduction of or the compensation for the inherent distortion is achieved by the volume of the adaptation layer that is applied.

In this case, the material of the adaptation layer ultimately consists plays no part in the invention. The material should merely be easy to handle and should be capable of being connected easily to the material of the bending transducer. In other words, it: should be possible for a firm and permanent connection between the adaptation layer and the bending transducer to be achieved.

The compensation of the inherent distortion may be achieved both with an adaptation layer with a low thermal coefficient of expansion and with an adaptation layer with a high thermal coefficient of expansion. For the purpose of compensation, either a larger or smaller volume of an adaptation layer is then applied. In addition, in order to compensate for the inherent thermal distortion, the adaptation layer can be applied both to the side of the bending transducer that is curved inward, in the event of inherent distortion, and to the side of the bending transducer that is curved outward in the event of inherent distortion.

In the case of a known material for the adaptation layer, the relationship between the volume of the adaptation layer to be applied in order to compensate for the inherent distortion, and the temperature variation of a predefined bending transducer type is best determined empirically. Since the bending transducers of a batch exhibit different inherent distortion values, the relationship mentioned may be found easily using a simple series of measurements.

The volume of the adaptation layer enables the inherent distortion value to be compensated for to the desired tolerance value for each bending transducer. The invention further permits bending transducers with any desired predefined inherent thermal distortion to be produced.

Otherwise, in principle, the relationship between the volume of the adaptation layer that will be applied to compensate for the inherent distortion, and the temperature variation of the bending transducer may be derived from the physical formula for volume expansion, using the cubic volume expansion coefficient.

In principle, the adaptation layer can of course be applied to both sides of the bending transducer. However, it is advantageous and significantly simpler to apply the adaptation layer to one side in order to compensate for the inherent thermal distortion. This is advantageous even when the piezoelectric bending transducer is designed as a bimorphous bending transducer, as it is known, that is to say when the piezoelectrically active layer is arranged on both sides of the supporting element.

In terms of production, it is beneficial if the inherent distortion of the bending transducer is compensated for or set by the cross-sectional area of the adaptation layer. In practical terms, the desired compensation of the inherent distortion is obtained by appropriately setting the length and/or the width of the material that is applied, with the thickness of the adaptation layer being constant.

The adaptation layer is advantageously applied using screen printing. Of course, the adaptation layer can naturally also be applied to the bending transducer in another way. This can be done, for example, by using adhesive bonding, evaporation deposition, sputtering on, or spraying on.

It is particularly advantageous if the adaptation layer is a plastic capable of being screen-printed. Such a plastic may be applied to the bending transducer in a simple way in fabrication terms by using the screen-printing process. The compensation of the inherent distortion is achieved by way of the length and the width of the adaptation layer that is printed on. In particular, an epoxy resin can easily be processed in this way. It has also been shown that epoxy resin has a beneficial thermal expansion coefficient, so that with relatively little material, the inherent distortions of the bending transducers that normally occur can easily be compensated for.

In a further advantageous refinement of the invention, the piezoelectric layer is a piezoceramic. A suitable piezoceramic is, for example, a PZT ceramic, as it is known, which is understood to include a lead-zirconate-titanium oxide ceramic. The composition of a piezoceramic of this type permits adaptation to different requirements. By applying a homogeneous electrical field, a polar axis is produced in the piezoceramic, which is necessary for the occurrence of the piezoelectric effect.

The supporting material of the supporting element plays only a subordinate part in the invention. However, for the mechanical properties of the bending transducer, in particular, a fiber composite material or a metal have proven to be beneficial.

Other features which are considered as characteristic for the invention are set forth in the appended claims.

Although the invention is illustrated and described herein as embodied in a piezoelectric bending transducer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a perspective view of a bending transducer.

DESCRIPTION OF THE PREFERRED EMBODIMENTS

Referring now to the sole drawing FIGURE, there is shown a bimorphous bending transducer 1 with a supporting element 2 and with a piezoelectrically active layer 3 made of a piezoceramic applied to both sides of the supporting element 2. In this case, the piezoceramic is a lead-zirconate-titanium oxide ceramic. The supporting element 2 is an epoxy resin reinforced with glass, carbon, or with aramide fibers. The raw material used for the supporting element 2 is an epoxy-resin prepreg (an as yet uncured blank), which has been thermally adhesively bonded to the piezoceramic by using a heat treatment. An adaptation layer 4 is arranged on one side of the bending transducer 1. Here, the adaptation layer 4 consists of an epoxy resin and has been applied by using a screen-printing process.

The bending transducer 1 also has electrical connections 6, which in each case are connected electrically via a soldered contact to the electrodes 7 and 8 that are located inside the transducer 1 and that have been applied two-dimensionally. The piezoelectrically active layers 3 also have outer electrodes 9 and 10, likewise designed two-dimensionally. In order to make electrical contact with the bending transducer 1, the inner electrodes 7 and 8 are led to the free part of the supporting element 2.

Alternatively, and not illustrated here, a further electrically conductive layer, which is designed as a web or in the form of parallel strips, can be inserted between the inner electrodes 7 and 8 and the supporting element 2 at the locations at which the piezoelectrically active layers 3 are placed. This increases the security against failure of the piezoelectric bending transducer 1.

Overall, the bending transducer 1 has a length of 25 mm, a width of 7 mm and a thickness of 0.5 mm. The thickness of the lead-zirconate-titanium oxide ceramic is 0.13 mm in this case.

In such a bending transducer 1, fluctuations of between 1 and 5 $\mu$m/10 K have resulted in the inherent distortion. In this case, ±4 $\mu$m/10 K of inherent thermal distortion may be compensated for by applying an adaptation layer 4 of epoxy resin with a length of 15 mm, a width of 2 to 5 mm and a thickness of 10 to 30 $\mu$m. The adaptation layer 4 is in this case applied directly to the outer electrode 9 or 10 in accordance with the determined inherent thermal distortion in the finished bending transducer 1.

In the case of the bending transducer 1, the inherent thermal distortion is substantially completely compensated for over a temperature range of −30 to +80° C. In the specified temperature range, the inherent distortion is less than 1 μm/10° K.

We claim:

1. A piezoelectric bending transducer, comprising:

a supporting element having opposite sides;

a piezoelectrically active layer applied to at least one of said sides of said supporting element; and an adaptation layer disposed on said piezoelectrically active layer, said adaptation layer having a given constant thickness, a given length and a given width, thereby providing a predefined volume for at least partially compensating and reducing inherent thermal distortion in the piezoelectric bending transducer.

2. The piezoelectric bending transducer according to claim 1, wherein said piezoelectrically active layer is applied to both of said sides of said supporting element, and said adaptation layer is applied to said piezoelectricatly active layer on one of said aides of said supporting element.

3. The piezoelectric bending transducer according to claim 2, wherein said adaptation layer 1 is a screen-printed layer.

4. The piezoelectric bending transducer according to claim 2, wherein said adaptation layer is a plastic suitable for screen printing.

5. The piezoelectric bending transducer according to claim 4, wherein said adaptation layer is an epoxy resin.

6. The piezoelectric bending transducer according to claim 1, Wherein said adaptation layer is a screen-printed layer.

7. The piezoelectric bending transducer according to claim 1, wherein said adaptation layer is a plastic suitable for screen printing.

8. The piezoelectric bending transducer according to claim 7, wherein said adaptation layer is an epoxy resin.

9. The piezoelectric bending transducer according to claim 1, wherein said piezoelectrically active layer is a piezoceramic.

10. The piezoelectric bending transducer according to claim 1, comprising: an electrode interposed between said adaptation layer and said piezoelectrically active layer.

* * * * *

UNITED STATES PATENT AND TRADEMARK OFFICE
CERTIFICATE OF CORRECTION

PATENT NO.    : 6,624,550 B2
DATED         : September 23, 2003
INVENTOR(S)   : Horst Biesenecker et al.

It is certified that error appears in the above-identified patent and that said Letters Patent is hereby corrected as shown below:

<u>Title page,</u>
Item [30], Foreign Application Priority Data, should read as follows:
-- Aug. 30, 1999      (DE)    ......... 199 41 112.3 --

Signed and Sealed this

Eighteenth Day of May, 2004

JON W. DUDAS
*Acting Director of the United States Patent and Trademark Office*